United States Patent [19]

Dubin et al.

[11] Patent Number: 4,960,660

[45] Date of Patent: Oct. 2, 1990

[54] HIGH RESOLUTION SUPERIMPOSED IMAGES FROM PHOTOPOLYMER ELECTROGRAPHIC MASTER

[75] Inventors: Alan S. Dubin, Greenville; Catharine E. Looney, Wilmington, both of Del.; Steven P. Schmidt, Chester Springs, Pa.

[73] Assignee: E. I. Du Pont de Nemours and Company, Wilmington, Del.

[21] Appl. No.: 331,487

[22] Filed: Mar. 31, 1989

[51] Int. Cl.$^5$ .................. G03G 13/28; G03G 13/01; G03C 1/725

[52] U.S. Cl. ....................... 430/49; 430/54; 430/15; 430/44; 430/48; 430/281

[58] Field of Search ............ 430/54, 15, 44, 48, 430/281, 49

[56] References Cited

U.S. PATENT DOCUMENTS

| | | |
|---|---|---|
| 3,337,341 | 8/1967 | Ryan ........................... 430/15 |
| 3,980,476 | 9/1976 | Wysocki ..................... 430/54 X |
| 4,732,831 | 3/1988 | Riesenfeld et al. ......... 430/49 |
| 4,859,551 | 8/1989 | Kempf ........................ 430/49 |

*Primary Examiner*—Jose Dees
*Assistant Examiner*—S. Crossan

[57] ABSTRACT

Process for preparation of high resolution image exposing imagewise a photopolymerizable element having a removable cover sheet and a conductive support or a temporary support which is replaced by a conductive support, stripping the cover sheet and laminating the imagewise exposed photopolymerizable layer to a second exposed photopolymerizable layer on a temporary support, removing the temporary support, charging electrostatically the exposed photopolymerizable layers, developing, e.g., liquid electrostatic developer or dry toner developer, and optionally transferring the developed image to a receptor surface, e.g., paper. The process is useful in preparing multiple copies in more than one version, e.g., logos, headlines, corrections, etc.

30 Claims, 5 Drawing Sheets

HIGH RESOLUTION SUPERIMPOSED IMAGES FROM PHOTOPOLYMER ELECTROGRAPHIC MASTER

TECHNICAL FIELD

This invention relates to a process for the preparation of high resolution superimposed or superpositioned images. More particularly this invention relates to a process for the preparation of high resolution superimposed images using a photopolymer electrographic element.

BACKGROUND OF THE INVENTION

It is known that photopolymerizable elements can be used in electrographic applications. Ingersoll U.S. Pat. No. 3,286,025, for example, relates to electrographic imaging. A photopolymerizable layer comprising a polymeric binder, an ethylenically unsaturated monomer, and a photoinitiator is imagewise exposed, the exposure creating polymerized areas of reduced conductivity. When the imagewise-polymerized layer on a conductive support is corona charged and toned or developed, a developed image is formed on the polymerized areas. Ingersoll states that multiple copies can be made and describes a procedure whereby the nonimage areas of the photopolymerized element are washed out with a solvent, the developed element is placed on an offset press and printing is accomplished by lithographic technique. Ingersoll, however, does not disclose transferring a developed image to another support.

In Riesenfeld et al. U.S. Pat. No. 4,732,831 there is described an image transfer process using a photopolymerizable electrographic element wherein the photopolymerizable layer is imagewise exposed, the exposed areas are electrostatically charged while present on a conductive support and then developed by applying an oppositely charged electrostatic developer, and the developed image is transferred to another surface. In the process of U.S. Pat. No. 4,732,831 the single photopolymer layer is imagewise exposed using a single image bearing film or phototool, then charged and developed on the same side. Such a process results in a wrong-reading image being obtained on transfer to a receptor support unless the image bearing film or phototool is so configured to provide a wrong reading latent image on the surface of the photopolymerized layer which upon transfer is inverted to form a correct reading image (See FIG. 1).

It is desired that a second image derived from a second image-bearing film such as a color separation negative be added to an imaged electrographic photopolymerizable element, so that high quality, high resolution superimposed images be obtained from toned electrographic photopolymerizable elements. It is particularly desired that such superimposed, high resolution images be obtained by using liquid electrostatic developers.

Superposition of images derived from separate image-bearing films or phototools using a single electrographic master is useful whenever multiple copies of a document or pictorial are desired in more than one version, the second version involving the addition of text or pictorial information to the original version. Applications are found wherever some additional information is to be directed to only a portion of the recipients of the documents. Examples include additions of highlighting, headlines, logos, corrections, or perhaps proprietary information.

The two-layer superposition of the present invention offers several advantages over a superposition image made by a single layer photopolymer electrographic element which had been imaged previously as described in U.S. Pat. No. 4,732,831. The two-layer superposition is applicable to optically positive as well as negative-working systems. Also, the superposition of electrographic photopolymerizable elements can be done by lamination directly in a hardcopy output device, after prints have been made from the first image-bearing layer and off-line imagewise exposure of the second layer.

An additional feature of the present invention is that the charge decay rates of the two photopolymerizable layers can be different from one another so that the superimposed developed image derived from the image of the second layer can be of a different color from that of the first developed image derived from the image of the first layer. This 2-color image can be accomplished by charging the layered photopolymerizable composition with a single scorotron in a single pass followed by sequentially developing with two differently colored developers. Any combination of the two developers can be used to emphasize headlines, logos, highlights and the like with a second color, differing from the color of the basic document.

SUMMARY OF THE INVENTION

In accordance with this invention there is provided a process for the preparation of high resolution images comprising (A) exposing a photopolymerizable electrographic element comprising in order; a conductive support, a first photopolymerizable layer and a strippable cover sheet, imagewise to actinic radiation through the cover sheet;

(B) stripping the cover sheet from the imagewise exposed photopolymerizable layer;

(C) laminating the surface of the imagewise exposed photopolymerizable layer to a photopolymerizable element comprising an imagewise exposed photopolymerizable layer on a temporary surface, the two photopolymerizable layers in contact;

(D) peeling off the temporary surface from the exposed photopolymerizable layer;

(E) charging electrostatically the exposed photopolymerizable layers; and (F) developing the electrostatically charged exposed image with a first developer.

In accordance with an embodiment of this invention there is provided a process for the preparation of a high resolution, correct reading image comprising (A) exposing a photopolymerizable electrographic element comprising in order, a temporary support, a first photopolymerizable layer, and a strippable cover sheet, imagewise to actinic radiation through the cover sheet;

(B) stripping the cover sheet from the exposed photopolymerizable layer;

(C) laminating the surface of the exposed photopolymerizable layer to a conductive substrate;

(D) peeling off the temporary support from the exposed photopolymerizable layer;

(E) laminating to the surface of the imagewise exposed photopolymerizable layer a photopolymerizable element comprising an imagewise exposed photopolymerizable layer on a temporary surface, the two photopolymerizable layers in contact;

(F) peeling off the temporary surface from the exposed photopolymerizable layer;

(G) charging electrostatically the exposed photopolymerizable layers to form a latent image of electrostatic charge on the exposed areas;

(H) developing the electrostatically charged exposed image with a developer.

BRIEF DESCRIPTION OF THE DRAWINGS

In the accompanying drawings forming a material part of this disclosure.

DETAILED DESCRIPTION OF THE INVENTION

Figure 1:
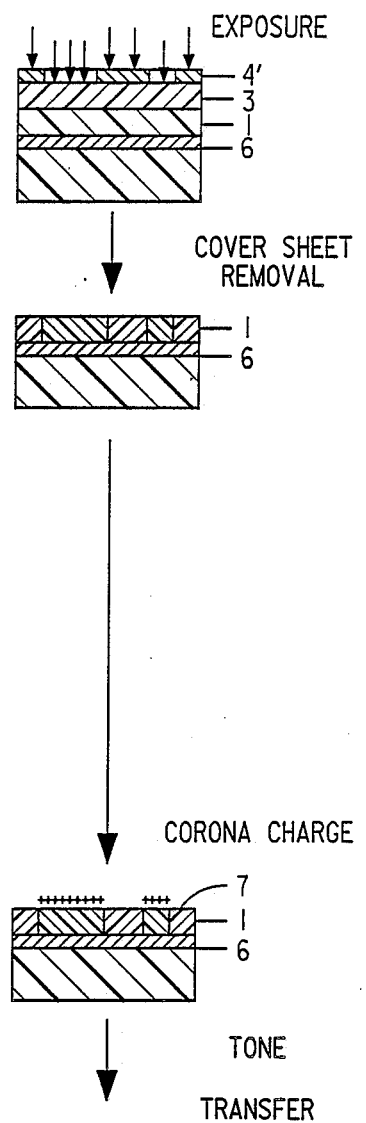
FIG. 1 is a cross-sectional view of a photopolymer electrographic element and the various stages of the preparation of a transferred image according to the prior art.

The photohardenable (photopolymerizable) layer of the electrostatic element consists essentially of an organic polymeric binder, at least one compound having at least one ethylenically unsaturated group which can be a monomer, a photoinitiator, optionally a chain transfer agent, and optionally either (1) at least one organic electron donor, also known as p-type conducting compound or at least one organic electron acceptor, also known as an n-type conducting compound as described in Blanchet-Fincher et al. U.S. Ser. No. 116,655, filed Nov. 4, 1987, or (2) a substituted aromatic amino compound, and preferably a strong acid as described in Blanchet-Fincher et al. U.S. Ser. No. 117,189, filed Nov. 4, 1987. Preferably the chain transfer agent is present.

"Consisting essentially of" as used in this specification and claims means that there can be present in the photohardenable layer, in addition to the primary ingredients, other ingredients which do not prevent the advantages of the invention from being achieved. These other ingredients which can also be present are set out below. Polymeric binders, ethylenically unsaturated compounds, photoinitiators, including preferred hexaarylbiimidazole compounds (HABI's) and chain transfer agents are disclosed in Chambers U.S. Pat. No. 3,479,185, Baum et al. U.S. Pat. No. 3,652,275, Cescon U.S. Pat. No. 3,784,557, Dueber U.S. Pat. No. 4,162,162, and Dessauer U.S. Pat. No. 4,252,887, the disclosures of each of which, as well as the two U.S. patent applications set out above, are incorporated herein by reference.

Binders

Suitable organic polymeric binders include: the polymerized methylmethacrylate resins including copolymers thereof, polyvinyl acetals such as polyvinyl butyral and polyvinyl formal, vinylidene chloride copolymers (e.g., vinylidene chloride/acrylonitrile, vinylidene chloride/methacrylate and vinylidene chloride/vinylacetate copolymers), synthetic rubber (e.g., butadiene/acrylonitrile copolymers and chloro-2-butadiene-1,3-polymers), cellulose esters (e.g., cellulose acetate, cellulose acetate succinate and cellulose acetate butyrate), polyvinyl esters (e.g., polyvinyl acetate/acrylate, polyvinyl acetate/methacrylate and polyvinyl acetate), polyvinyl chloride and copolymers (e.g., polyvinyl chloride/acetate), polyurethanes, polystyrene, etc. Preferred binders are poly(styrene/methylmethacrylate) and polymethylmethacrylate. A preferred resistivity range of the exposed photohardened image areas is about $10^{14}$ to $10^{16}$ $\Omega$-cm, corresponding to a resistivity for the binder of $10^{16}$ to $10^{20}$ $\Omega$-cm range.

Ethylenically Unsaturated Compounds

Any ethylenically unsaturated photopolymerizable or photocrosslinkable compound identified in the prior patents for use in HABI-initiated systems can be used. The term "monomer" as used herein includes simple monomers as well as polymers, usually of number average molecular weight below 1500, having crosslinkable ethylenic groups. Number average molecular weights can be determined by known osmometry techniques. Preferred monomers are di-, tri- and tetra-acrylates and methacrylates such as ethylene glycol diacrylate, diethylene glycol diacrylate, triethylene glycol diacrylate, glycerol diacrylate, glycerol triacrylate, ethylene glycol dimethacrylate, 1,2-propanediol dimethacrylate, 1,2,4-butanetriol trimethacrylate, 1,4-diol diacrylate, 1,4-benzenediol dimethacrylate, pentaerythritol tetramethacrylate, 1,3-propanediol diacrylate, 1,5-pentanediol dimethacrylate, pentaerythritol triacrylate; the bisacrylates and bis-methacrylates of polyethylene glycols of molecular weight 100-500, etc. A particularly preferred monomer is ethoxylated trimethylolpropane triacrylate.

Impurities in the ethylenically unsaturated compound can be the major source of charge carriers. Therefore, the overall discharge rate of the photohardenable layer is determined largely by these ionizable impurities. In general, the resistivities of the ethylenically unsaturated compounds range from $10^5$ to $10^9$ $\Omega$-cm with the resultant compositions having a resistivity of $10^{11}$ to $10^{13}$ $\Omega$-cm in the unexposed areas of the photohardenable layer.

Initiators

Preferred initiators are the HABI photoinitiators, 2,2',4,4',5,5'-hexaarylbiimidazoles, sometimes called 2,4,5-triarylimidazolyl dimers, which dissociate on exposure to actinic radiation to form the corresponding triarylimidazolyl free radicals. As indicated above, HABI's and use of HABI-initiated photopolymerizable systems for applications other than for electrostatic uses are disclosed in a number of patents. These include: Cescon U.S. Pat. No. 3,784,557; Chambers U.S. Pat. No. 3,479,185; Chang et al. U.S. Pat. No. 3,549,367; Baum et al. U.S. Pat. No. 3,652,275; Dueber U.S. Pat.

No. 4,162,169; Dessauer U.S. Pat. No. 4,252,887; Chambers et al. U.S. Pat. No. 4,264,708; and Tanaka et al. U.S. Pat. No. 4,459,349; the disclosures of these patents are incorporated herein by reference. Any 2-o-substituted HABI disclosed in the prior patents can be used in this invention. The HABI's can be represented by the general formula

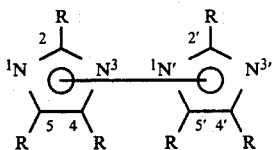

where the R's represent aryl radicals. The 2-o-substituted HABI's are those in which the aryl radicals at positions 2 and 2' are ortho-substituted. The other positions on the aryl radicals can be unsubstituted or carry any substituent which does not interfere with the dissociation of the HABI upon exposure or adversely affect the electrical or other characteristics of the photopolymer system.

Preferred HABI's are 2-o-chlorosubstituted hexaphenylbiimidazoles in which the other positions on the phenyl radicals are unsubstituted or substituted with chloro, methyl or methoxy. The most preferred HABI's are 2,2',4,4'-tetrakis(o-chloro-phenyl)-5,5'-bis(m,p-dimethoxyphenyl)-biimidazole (TCTM-HABI) and 2,2'-bis(o-chlorophenyl)-4 4',5,5'-tetraphenyl-biimidazole.

Processes for producing HABI compounds result in a mixture of isomers and other impurities. Use of high concentrations of these impure materials can provide photopolymerizable compositions with high sensitivity but poor shelflife or storage stability due to crystallization. It has been found that purification of the materials by various methods can provide relatively pure materials which can be used in high concentration without crystallization.

The HABI's can be purified sufficiently by dissolving them in methylene chloride, filtering and recrystallizing by adding methanol or ether. If desired, the solution of the HABI in methylene chloride can be eluted through a silica gel column prior to recrystallization. Preferred methods for purification of the preferred HABI's are as follows:

TCTM-HABI (1) Preferred method.

50 g of reddish brown TCTM-HABI (melting range 170-215° C.) is added to 425 ml ethanol and 100 ml of distilled water. The slurry is stirred for 5 to 10 minutes and allowed to settle for 30 minutes. Most of the supernatant red liquid is removed. 200 ml of distilled water is added and the fresh slurry is stirred 5 to 10 minutes and filtered through #54 (fast) paper. The collected solid is dried at 120° C. for 3 to 5 hours. The yield of white solid is 44 g (88%) and with melting range (m.r.) 170° to 220° C.

(2) Alternate method 50 g of reddish brown TCTM-HABI is added to 250 ml ethanol and 200 ml of water. After stirring the slurry for 10 minutes, it is allowed to settle for 10 minutes prior to filtration through #5 (slow) paper. The solid is collected and after drying yields a white powder with similar yield and m.r. as above.

o-Cl-HABI 225 g of o-Cl-HABI (m.r. 205-7° C.) is added to 1800 ml methylene chloride and solution heated to the boil. 150 g DARCO ® G-60 charcoal activated, EM Science, a division of EM Industries, Inc., Cherry Hill, N.J. is then added. The mixture is kept boiling for 30 to 45 minutes prior to hot filtration through Celite ® Diatomaceous Silica Product, Manville Products Corp., Denver, Colo. under vacuum. The filtrate is concentrated to yield ca. 135 g (60%) solid with m.r. 203-205° C. The filter pad is washed with 200 ml of methylene chloride and the filtrate concentrated to yield ca. 45 g (20%) solid with m.r. 203-207° C.

Additional photoinitiators that are also useful in the photohardenable composition include polynuclear quinones, aromatic ketones and benzoin ethers. Useful polynuclear quinones are: α-ethyl anthraquinone, 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone,- sodium salt of anthraquinone-sulfonic acid, 3-chloro-2-methylanthraquinone, retenequinone, 7,8,9,10-tetrahydronaphthacenequinone, 1,2,3,4-tetrahydrobenz(a)anthracene-7,12-dione; aromatic ketones, e.g., benzophenone, Michler's ketone (4,4'-bis(dimethylamino)benzophenone), 4,4'bis(diethylamino)benzophenone, 4-acryloxy-4'-dimethylaminobenzophenone, 4-acryloxy-4'diethylaminobenzophenone, 4-methoxy-4'dimethylaminobenzophenone, phenanthrenequinone, 2,7-di-t-butylphenanthrenequinone, etc.; benzoin ethers, e.g., benzoin methyl ether, benzoin ethyl ether, benzoin phenyl ether; methylbenzoin, ethylbenzoin, etc.

Present in the photopolymerizable composition as a preferred component is at least one organic electron donor (also known as a p-type conducting compound), or at least one organic electron acceptor (also known as an n-type conducting compound) described in Blanchet-Fincher et al. U.S. Ser. No. 116,655, filed Nov. 4, 1987, page 6, line 1 to page 7, line 20, the disclosure of which is incorporated herein by reference; or a substituted aromatic amino compound, and preferably a strong acid described in Blanchet-Fincher et al. U.S. Ser. No. 117,189, filed Nov. 4, 1987, page 12, line 18 to page 18, line 11, the disclosure of which is incorporated herein by reference. Useful electron donors and electron acceptors which are present in an amount of at least 0.1% by weight based on the photopolymerizable composition have an oxidation potential of less than +2.5 eV or a reduction potential larger than −3.0 eV, respectively. The substituted aromatic amino compound is present in an amount of at least 3% by weight (based on the total weight of the photopolymerizable composition).

In combination with a substituted aromatic amino compound, in nonoxidized form, there is present in the photopolymerizable layer a strong acid which is present in an amount of 0.33 mole to 1.0 mole per mole of amino nitrogen of the amino compound, and the combination of these compounds being present in an amount of at least 3% by weight, with the proviso that the substituted aromatic amino compound is present in an amount of at least 1.6% by weight, the weight percentages being based on the total weight of the photopolymerizable layer. The combination of substituted aromatic amino compound and acid are present in a total amount of 3 to 15% by weight, preferably 3 to 5% by weight based on the total weight of the photohardenable layer. The ratio of compound to acid is one acid molecule per amino group molecule on a molar basis.

Chain Transfer Agent

Any chain transfer agent (CTA) identified in the above-described United States patents for use with HABI-initiated photopolymerizable systems can be used. For example, Baum et al. U.S. Pat. No. 3,652,275 discloses N-phenylglycine, 1,1-dimethyl-3,5-diketocyclohexane, and organic thiols such as 2-mercaptobenzothiazole, 2-mercaptobenzoxazole, 2-mercaptobenzimidazole, pentaerythritol tetrakis (mercaptoacetate), 4-acetamidothiophenol, mercaptosuccinic acid, dodecanethiol, and betamercaptoethanol. Other compounds which can be used as chain transfer agents include: various tertiary amines known in the art, 2-mercaptoethane sulfonic acid, 1-phenyl-4H-tetrazole-5-thiol, 6-mercaptopurine monohydrate, bis-(5-mercapto-1,3,4-thiodiazol)-2-y1,2-mercapto-5-nitrobenzimidazole, and 2-mercapto-4-sulfo-6-chlorobenzoxazole. The preferred CTA's are 2-mercaptobenzoxazole (2-MBO) and 2-mercaptobenzothiazole (2-MBT). Especially preferred are 2-MBO and 2-MBT purified as illustrated below for 2-MBO:

2-MBO: Optimum Melting Point 193-194° C.

(1) For slightly impure lots (m.r.: 191-193° C.) the following procedure is employed:

A slurry of 300 g 2-MBO in 1500 mL methanol is stirred for 5 to 10 minutes and allowed to settle. Generally, the solvent layer assumes a red appearance due to impurities. The undissolved solid is filtered through #5 filter paper in a Buchner funnel with house vacuum. Solid is washed with cold methanol (1 100 ml portion), collected and dried in an oven at 70-80° C. for 3 to 5 hours, subsequently pulverized and dried for an additional hour. Yield is approximately 150 g (50%) of white powder, m.r. 193-94° C.

(2) For impure lots (m.p. below 191° C.) the following procedure is used:

250 g brown 2-MBO, 50 g DARCO® G-60, charcoal activated, as described above, 1500 ml methylene chloride and 600 ml methanol are stirred in a 4 liter Erlenmeyer flask with gentle boiling for 30 to 40 minutes. The mixture is filtered hot through fast (#4) paper under low vacuum. The red liquor that is collected is concentrated under low vacuum until 2-MBO precipitates out of solution. 200 ml of fresh methanol is added, and the resulting slurry is agitated to break up large lumps. The slurry is filtered through slow (#5) paper and washed with 50 ml fresh methanol. The colorless precipitate is collected and dried at 70 to 80 degrees for 3 to 5 hours as above. Yield of product, melting above 192° C. is ca. 50%.

Additives

In addition to the primary ingredients of polymeric binder, ethylenically unsaturated compound, initiator, and preferred chain transfer agent, the photohardenable compositions can contain conventional ingredients such as co-initiators, thermal stabilizers, plasticizers, optical brighteners, energy transfer dyes (i.e., visible light sensitizers), UV absorbers, photoinhibitors, etc. The preferred thermal stabilizer is 1,4,4-trimethyl-2,3-diazobicyclo-(3.2.2)-non-2-ene-N,N-dioxide (TAOBN). Leuco dyes can also be present, e.g., Leuco Malachite Green, Leuco Crystal Violet, and leuco dyes disclosed in Baum et al. U.S. Pat. No. 3,652,275, col. 7, line 40 to col. 11, line 31, the disclosure of which is incorporated herein by reference. Visible light sensitizers and photoinhibitors are disclosed in Dueber U.S. Pat. No. 4,162,162 and Pazos U.S. Pat. No. 4,198,242, respectively, the disclosure of which are incorporated herein by reference.

In general, the essential components should be used in the following approximate proportions: binder 40-75 percent, preferably 50-65 percent; monomer 15-40 percent, preferably 20-32 percent; initiator 1-20 percent, preferably 1-16 percent; and preferably a chain transfer agent 0-5 percent, preferably 0.1-4 percent. These are weight percentages based on total weight of the photopolymerizable composition. The preferred proportions depend upon the particular compounds selected for each component. For example, a high conductivity monomer can be used in smaller amount than a low conductivity monomer, since the former will be more efficient in eliminating charge from unexposed areas.

The amount of photoinitiator such as HABI and chain transfer agent, e.g., 2-MBO, etc. incorporated in the photohardenable layer will depend upon film speed requirement. Higher speed compositions can be used with laser imaging in recording digitized information, as in digital color proofing. For analog applications, e.g., exposure through a negative, film speed requirement depends upon mode of exposure. If the exposure device is a flat-bed type, where the negative is placed over the photopolymer matrix, exposures of up to 60 seconds can be used and a photographically slow film will be acceptable. For a drum exposure device, with a collimated source of radiation, the exposure per pixel may be brief and a higher speed photopolymer layer may be more useful.

The photohardenable layer is prepared by mixing the ingredients of the photopolymerizable system in a solvent such as methylene chloride usually in a weight ratio of about 15:85 to 25:75, coating a substrate, and evaporating the solvent. Coating thickness should be uniform and about 3 to 15 $\mu$m, preferably 7 to 12 $\mu$m dry. Dry coating weight should be about 30 to 150 mg/dm$^2$, preferably 70 to 130 mg/dm$^2$ The support of the photopolymerizable element can be any surface to which the photopolymer layer can be coated or laminated thereto and optionally easily removed therefrom by peeling or stripping. Suitable conductive supports include metal plates such as aluminum, copper, zinc, silver or the like; a conductive polymeric film; a support such as paper, glass, synthetic resin and the like, which has been coated on one or both sides with a metal, conductive metal oxide, or metal halide by vapor deposition or sputtering chemical deposition; a support which has been coated with a conductive polymer; or a support which has been coated with a polymeric binder containing a metal, conductive metal oxide, metal halide, conductive polymer, carbon, or other conductive fillers. Suitable strippable supports include polymeric films such as polyethylene terephthalate and other polyesters, polyethylene, polypropylene, etc. which may have suitable release layers present thereon, e.g., silicone release layer, gel subbing layer, etc.

The cover sheet for the photopolymerizable element must be easily removed from the photopolymerized layer, e.g., by stripping or other type of removal operation. Examples of suitable cover sheets include polyethylene, polypropylene, polyester, etc. Polypropylene is preferred. The cover sheet can be treated with silicone or other material to aid strippability.

The photopolymerizable element is exposed by actinic radiation which is an energy source whereby the exposed areas become hardened or polymerized. Suitable radiation depends on the sensitivity of the particular photopolymerizable layer composition used to form the photopolymerizable layer. Generally standard ultraviolet energy sources are used. If, however, the photopolymerizable composition is sensitive to visible light then that type of exposure source can be used. Exposure sources can also be of the laser type. The exposing radiation can be modulated either by digital or analog means. Analog exposure utilizes a line or half-tone negative or other pattern interposed between the radiation source and photopolymerizable layer. It is preferred that when the image is present as a negative photographic film the emulsion side be placed adjacent to the photopolymerizable layer. Digital exposure is by means of a computer controlled visible light-emitting laser which can scan the film in raster fashion. For digital exposure a high speed photopolymerizable element is utilized, e.g., one containing a high-level of hexaarylbiimidazole photoinitiator, chain transfer agent and sensitized to higher wavelength light with a sensitizing dye.

The composition of the two photopolymer layers may differ in charge decay rates so that the image on one layer dissipates in a shorter time, $t_1$, while the second layer dissipates in a longer time, $t_2$, after electrostatic charging. Photopolymerizable compositions with typically short decay times are described in Blanchet-Fincher et al., U.S. Ser. No. 116,665 filed Nov. 4, 1987 or in Blanchet-Fincher et al., U.S. Ser. No. 117,189 filed Nov. 4, 1987; compositions with longer decay times are described in Riesenfeld et al., United States Pat. No. 4,732,831, the disclosures of which are incorporated herein by reference. Toning prior to $t_1$ yields a first toned image of both layers but toning between $t_1$ and $t_2$ yields a second toned image of only the layer with the slower decay rate. The toned image on the second layer can therefore be the same or a different color than that of the first layer.

Prior to or after the imagewise exposure the cover sheet can be removed by stripping or peeling as is known to those of ordinary skill in the art. The exposed photopolymer surface from which the cover sheet has been removed is then laminated generally at elevated temperature to a photopolymerizable element comprising an imagewise exposed photopolymerizable layer on a temporary surface or support, the two photopolymerizable layers in contact. The temporary surface includes polymeric films such as polyethylene terephthalate and other polyesters, polyethylene, polypropylene, etc. which may have suitable release layers present thereon, e.g., silicone release layer, gel subbing layer, etc. The temporary surface also may be a conductive support of any type such as a conductive polymeric film, paper, synthetic resin, etc., which has been coated on one or both sides with a metal, conductive oxide, or metal halide by vapor deposition or sputtering chemical deposition. Preferably the nonconductive temporary surface is used since it is cheaper. The linear half-tone negative or phototool used to imagewise expose this element may be the same as that used for imagewise exposure of the first element or may be different. Lamination is accomplished by procedures known to those skilled in the art. The temperature must not be greater than the temperature that degrades the photopolymerizable layer. After the lamination, the temporary surface is peeled or stripped from the exposed photopolymerizable layer. Stripping and peeling operations are known to those skilled in the art.

The preferred charging means for the photopolymerizable layer is corona discharge. Other charging methods, e.g., discharge of a capacitor, etc. can also be used.

After the imagewise exposed photopolymerizable layers are electrostatically charged, the surface open to the air is developed by means of a first electrostatic dry toner developer or liquid electrostatic developer, the latter being preferred. Dry electrostatic toner developers are known to those skilled in the art. Any known electrostatic liquid developer and any known method of developer application can be used. Preferred liquid electrostatic developers are suspensions of pigmented resin toner particles in nonpolar liquids which are generally charged with charge director compounds, e.g., ionic or zwitterionic compounds. The nonpolar liquids normally used are the Isopar ® branched-chain aliphatic hydrocarbons (sold by Exxon Corporation) which have a Kauri-butanol value of less than 30 and optionally containing various adjuvants as described in Mitchell U.S. Pat. Nos. 4,631,244 and 4,663,264, Taggi U.S. Pat. No. 4,670,370, Larson and Trout U.S. Pat. No. 4,681,831, El-Sayed and Taggi U.S. Pat. No. 4,702,984, Larson U.S. Pat. No. 4,702,985, Trout U.S. Pat. No. 4,707,429, and Mitchell U.S. Pat. No. 4,734,352. The disclosures of these patents are incorporated herein by reference. The above nonpolar liquids are narrow high-purity cuts of isoparaffinic hydrocarbon fractions with the following boiling ranges: Isopar ®-G 157–176° C.; Isopar ®-H 176–191° C.; Isopar ®-K 177–197° C.; Isopar ®-L 188–206° C.; Isopar ®-M 207–254° C.; Isopar ®-V 254–329° C. Other known hydrocarbon liquids can be used as well. Preferred resins of the liquid electrostatic developers are copolymers of ethylene (80 to 99.9%)/acrylic or methacrylic acid (20 to 0%)/alkyl ester of acrylic or methacrylic acid where alkyl is 1 to 5 carbon atoms (0 to 20%), e.g., copolymers of ethylene (89%) and methacrylic acid (11%) having a melt index at 190° C. of 100. Other resins disclosed in the above United States patents are also useful. The disclosure relating to resins from these patents is incorporated herein by reference. The resin toner particles preferably have an average particle size of (by area) less than 10 $\mu$m, as measured by a Horiba CAPA-500 centrifugal particle analyzer, Horiba Instruments, Inc., Irvine, Calif. Preferred nonpolar liquid soluble ionic or zwitterionic components are lecithin and Basic Barium Petronate ® oil-soluble petroleum sulfonate manufactured by Sonneborn Division of Witco Chemical Corp., New York, N.Y. Many of the monomers useful in the photohardenable composition are soluble in these Isopar ® hydrocarbons, especially in Isopar ®-L, as well as other nonpolar liquids. Consequently, repeated toning with Isopar ® based toners to make multiple copies can deteriorate the electrical properties of the master by extraction of monomer from unexposed areas. The preferred monomers are relatively insoluble in Isopar ® hydrocarbons, and extended contact with these liquids does not unduly deteriorate films made with these monomers. Photopolymerizable electrostatic elements made with other, more soluble monomers can still be used to make multiple copies, using liquid developers having a dispersant with less solvent action.

After toning with dry toner developers or developing with liquid electrostatic developer the developed image can be transferred to another surface or receptive support, such as paper, for the preparation of an image. Other receptor supports include, but are not limited to, polymeric films, cloth or other printable materials and surfaces. For making integrated circuit boards, the transfer surface can be an insulating board on which conductive circuit lines can be printed by this process, or it can be an insulating board covered with a conductor, e.g., a fiber glass board covered with a copper layer, on which a resist is printed by this process. Transfer is accomplished by electrostatic or other means, e.g., by contact with an adhesive receptor surface or applying pressure and heat, or a combination of these methods. Electrostatic transfer can be accomplished in any known manner, e.g., by placing the receptive support on a conductive cylinder and bringing the toned surface within 0.002 to 0.1 inch (0.05 to 2.54 mm) of the paper, the gap being filled with Isopar ® hydrocarbon. A positive potential is applied to the conductive cylinder, driving the negative toner particles of the developer off the photohardenable electrostatic master onto the receptive support, e.g., paper. Alternately the paper may be placed in contact with the developed image using a tackdown roll or corona which when held at negative voltages will press the two surfaces together assuring intimate contact. After tackdown a positive corona discharge is applied to the backside of the paper driving the toner particles of the developer off the photohardenable electrostatic master onto the paper. In making multiple images from a single imagewise exposed photopolymerizable element, it is only necessary to repeat the steps of charging electrostatically, toning and transferring. Each transfer requires a separate receptor support or surface.

INDUSTRIAL APPLICABILITY

Superposition of images using electrographic masters is useful whenever multiple copies of a document or pictorial are desired in more than one version, the second version involving the addition of text or pictorial information to the original version. Applications are found wherever some additional information is to be directed to only a portion of the recipients of the documents. Examples include additions of highlighting, headlines, logos, corrections, or perhaps proprietary information.

EXAMPLES

Figure 2:
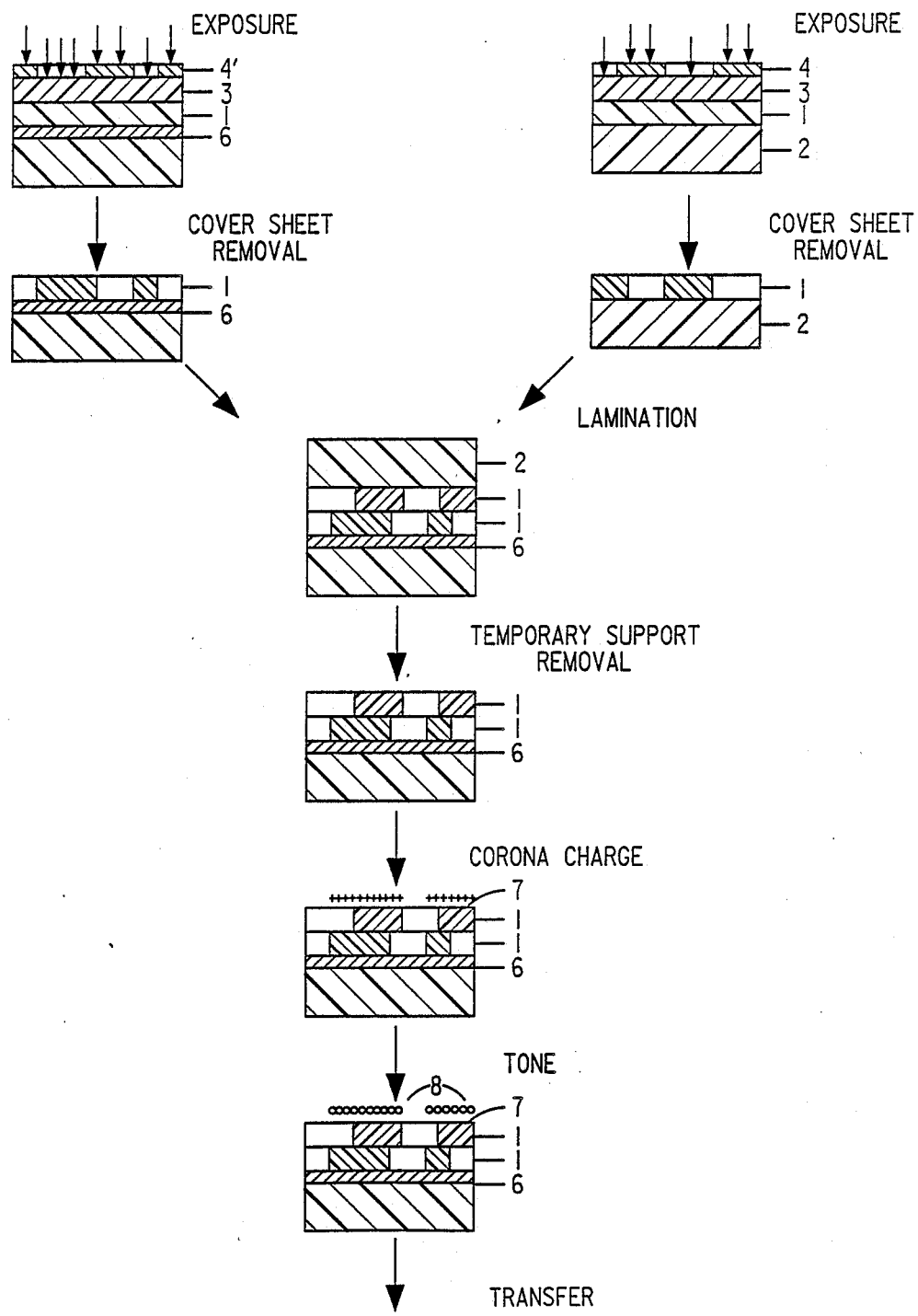
FIG. 2 is a cross-sectional view of a photopolymer electrographic element and the various stages of the preparation of a superimposed or superpositioned high resolution transferred image according to the invention.
Figure 3:
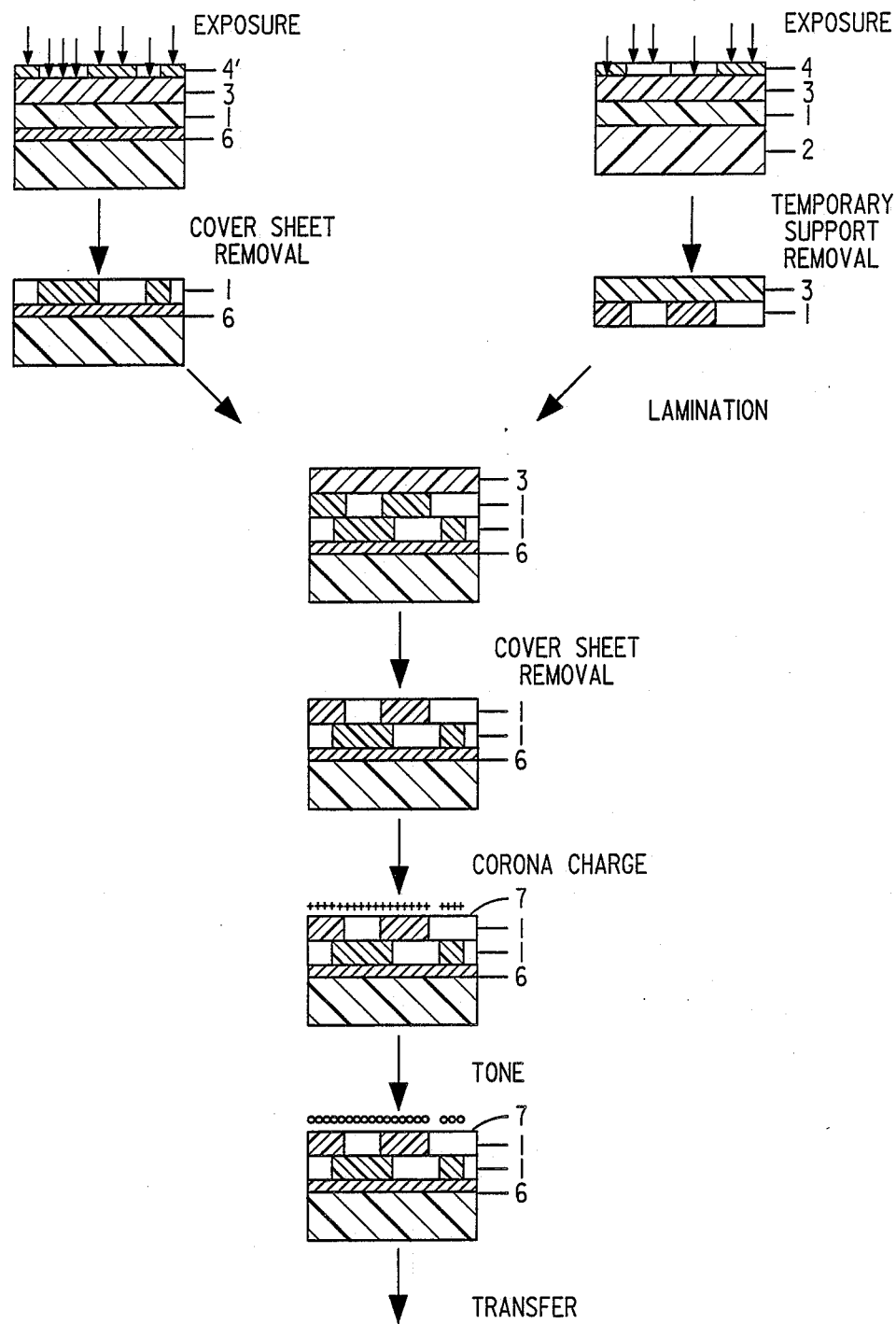
FIG. 3 is a cross-sectional view of a photopolymer electrographic element and the various stages of the preparation of a superimposed or superpositioned high resolution transferred image according to the invention.
Figure 4:
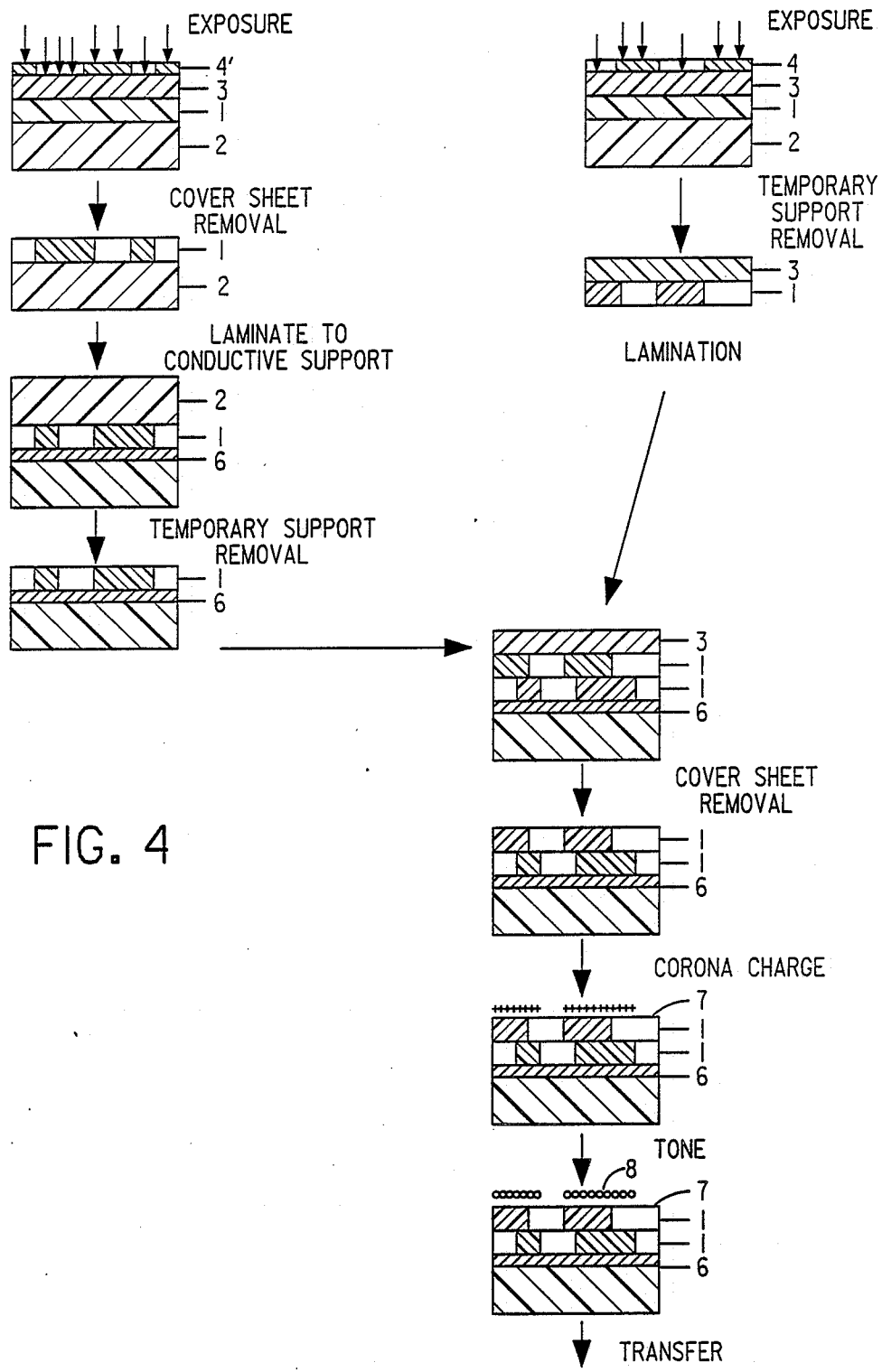
FIG. 4 is a cross-sectional view of a photopolymer electrographic element and the various stages of another preparation of a superimposed or superpositioned high resolution transferred image according to the invention.
Figure 5:
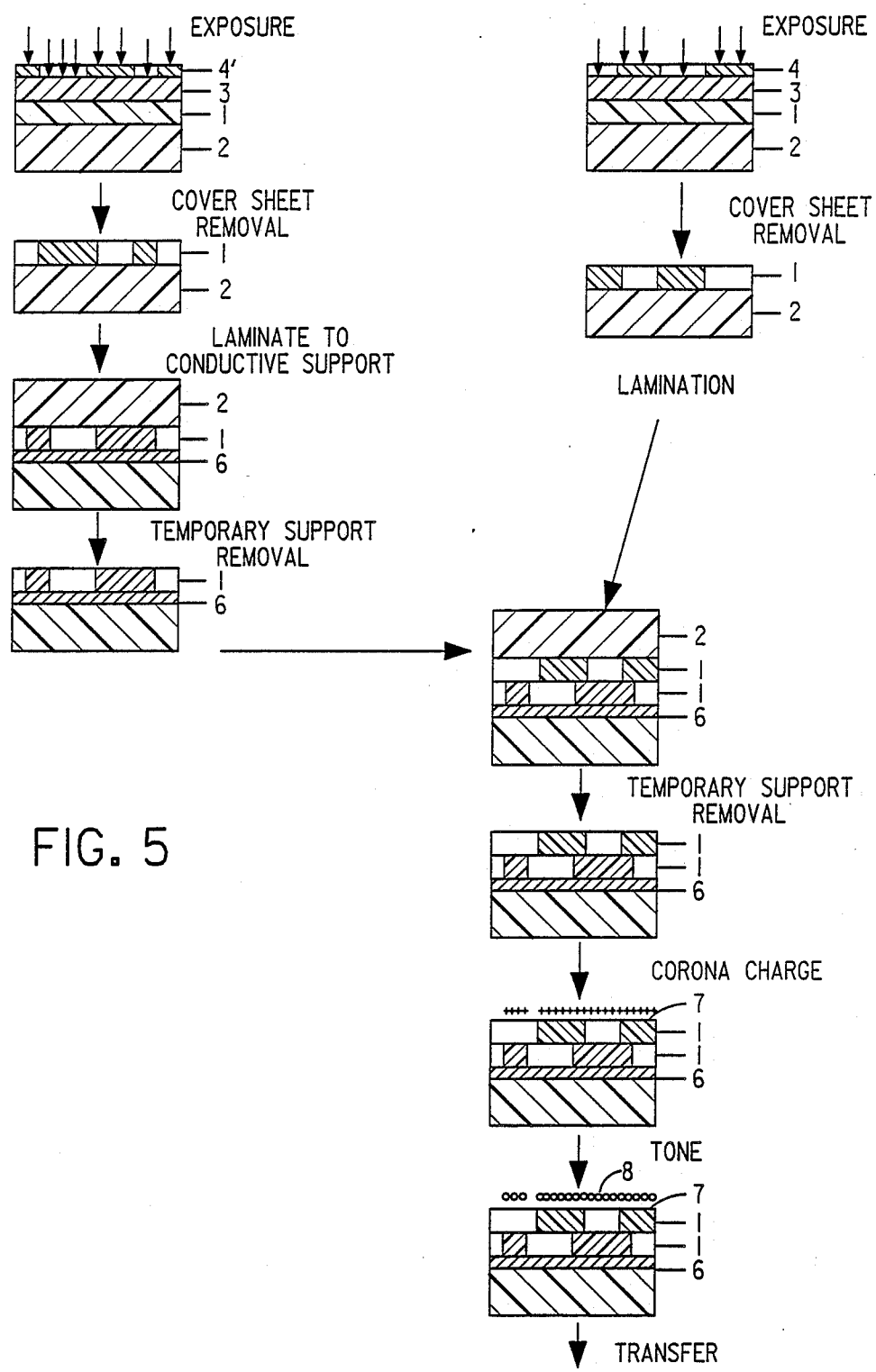
FIG. 5 is a cross-sectional view of a photopolymer electrographic element and the various stages of another preparation of a superimposed or superpositioned high resolution transferred image according to the invention.

The following examples illustrate but do not limit the invention wherein the percentages are by weight. In Examples 1 to 3 the numbers set out for components of the element correspond to the numbers used in the Figures. Examples 1 and 2 are illustrated in FIG. 2 and Example 3 is illustrated in FIG. 3. Example 7 illustrates the embodiments of the invention shown in FIGS. 4 and 5.

EXAMPLE 1

A photopolymerizable composition consisting of 57.0% poly(styrene-methylmethacrylate), 28.6% ethoxylated trimethylolpropane triacrylate, 10.6% 2,2',4,4'-chlorophenyl)-5,5'-bis(m,p-dimethoxyphenyl)-biimidazole, and 3.8% 2-mercaptobenzoxazole was coated on an 0.004 inch (0.0102 cm) aluminized polyethylene terephthalate film substrate 6. A 0.00075 inch (0.0019 cm) polypropylene cover sheet 3 was laminated to the dried photopolymerizable layer 1. The photopolymerizable element was exposed imagewise for 8 integrated intensity units through a halftone negative film 4' with its emulsion side in contact with the cover sheet, using a Douthitt Option X exposure unit (manufactured by Douthitt Corp., Detroit, Mich.), equipped with a model TU 64 Violux ® 5002 lamp assembly (Exposure Systems Corp., Bridgeport, Conn.) and a photopolymer type 5027 lamp. The cover sheet was then removed.

A second coating having the photopolymerizable composition described above was made separately on a 0.007 inch (0.0178 cm) temporary polyethylene terephthalate support 2. A 0.00075 inch (0.0019 cm) polypropylene cover sheet 3 was laminated to the dried photopolymerizable layer 1. This element was imagewise exposed as described above for 8 integrated intensity units through a second halftone negative film 4. The cover sheet 3 was removed. The revealed surface of the second photopolymerizable layer was laminated to the surface of the first photopolymerizable layer 1 with a heated (220° F.) two roll device at 1 inch (2.54 cm)/sec, the two photopolymerizable layers being in contact. The temporary polyethylene terephthalate support 2 was then removed, leaving the two laminated photopolymerized layers on the aluminized polyethylene terephthalate support.

The layered photopolymerized film was charged positively by passing over a +4.8 kV corotron at 0.5 inch (1.77 cm)/sec. The photopolymerized film surface 7 was then toned with a negatively charged liquid electrostatic developer (toner 8), using a 0.04 inch (1.016 mm) developer-filled gap between a flat development electrode and the charged film.

The liquid developer was prepared using the following procedure:

200 grams of a copolymer of ethylene (89%) and methacrylic acid (11%) melt index at 190° C. of 100, acid no. 66; 25.6 grams of Sterling ® NS carbon black, Cabot Corp., Boston, Mass., 1.6 grams of Monastral ® Blue BT 583D, Heubach, Inc., Newark N.J., and 1000 grams of Isopar ®-L, Exxon Corp., were placed in a Union Process 1-S Attritor, Union Process Company, Akron, Ohio, along with 0.1875 inch (0.4763 cm) diameter stainless steel balls. The contents were heated to 100° C.+/−10° C. and milled at 220 rpm for 2 hours. The Attritor was then cooled to 25° C.+/−5° C., while the milling continued and 700 grams of Isopar ®-H were added. Milling was continued at 330 rpm for 16 hours, affording a dispersion of toner particles with average particle size (by area) of 1.5 μm measured using the Horiba CAPA 500 centrifugal particle size analyzer. The toner concentrate was separated from the stainless steel media and diluted to 2 percent solids by the addition of Isopar ®-H. Two kg of toner were charged by the addition of 12 g of a 10% solution of lecithin (Fisher Scientific, Pittsburgh, Pa.) in Isopar ®-H. The charged toner was diluted to 0.5% solids by the addition of Isopar ®-H and was used as such to tone the charged photopolymer image.

The resulting toned image was a superposition of the images of the two photopolymerizable layers. The image resulting from the bottom layer (the layer contacting the conductive support) was of the same handedness as that of the halftone negative film 4' used for exposure when viewed with the emulsion side down. The image resulting from the top layer was laterally reversed from the image of the halftone negative film 4 used for exposure. A halftone dot range of 2-97% (150 lines/inch screen) was achieved for the toned image from the top layer.

The toned image was electrostatically transferred to paper using a bias roll. Plainwell Solitaire offset enamel paper (Plainwell Co., Plainwell, Mich.) was wrapped around a metal drum to which a voltage of +200 V was applied. The toned photopolymerizable film was spaced 0.006 inch (0.015 cm) from the paper, the gap being filled with Isopar ®-H. Transfer was carried out at 0.17 inch 0.432 cm) per second. Lateral reversal of the image occurs in transfer: the image on paper is of opposite handedness as that of the toned photopolymerizable film. The paper was removed from the bias roll and was heated at 110° C. for 1 minute to fuse the toned image and fix it to the paper. Transferred dot range was 2-90% (150 line/inch screen) for the image corresponding to the top photopolymerizable layer, and 30-90% for the image corresponding to the bottom photopolymerizable layer.

EXAMPLE 2

A photopolymerizable composition consisting of 57.0% polymethylmethacrylate, 28.6% ethoxylated trimethylolpropane triacrylate, 10.6% 2,2',4,4'-tetra-kis-(o-chlorophenyl)-5,5'-bis(m,p-dimethoxyphenyl)-biimidazole, and 3.8% 2-mercaptobenzoxazole was coated on a 0.004 inch (0.0102 cm) aluminized polyethylene terephthalate film support 6. A 0.00075 inch (0.0019 cm) polypropylene cover sheet 3 was laminated to the dried photopolymerizable layer 1. The photopolymerizable element was imagewise exposed through a halftone negative film 4' as described in Example 1.

A second photopolymerizable coating (of the same composition as above) was made separately on 0.004 inch (0.0102 cm) temporary polyethylene terephthalate support 2 which had a gel adhesive coating. A 0.00075 inch (0.0019 cm) polypropylene cover sheet 3 was laminated to the dried photopolymerizable layer 1. This element was imagewise exposed through a second halftone negative film 4, the cover sheet 3 was removed, and the revealed surface of the photopolymerizable layer was laminated as described in Example 1 to the surface of the first photopolymerizable layer 1. The temporary polyethylene terephthalate support 2 was then removed, leaving the two exposed photopolymerizable layers on the aluminized polyethylene terephthalate support.

The photopolymerized film was charged by passing over a +4.5 kV corotron at 0.5 inch (1.77 cm)/sec, and the surface 7 with liquid toner 8 was toned as described in Example 1. The resulting toned image was a superposition of the images of the two photopolymerizable layers with the image resulting from the bottom layer (the layer contacting the conductive support) of the same handedness as that of the halftone negative film 4' used for exposure. The image resulting from the top layer was laterally reversed from the image of the halftone negative film 4 used for exposure.

The toned image was transferred to paper and fused as described in Example 1. A halftone dot range of 4-90% (150 line/inch screen) was achieved for the image from the top layer, with good solid areas and line-work from the image from the bottom layer.

EXAMPLE 3

The photopolymerizable composition described Example 1 was coated on aluminized polyethylene terephthalate 6, exposed, and the cover sheet 3 removed as described in Example 1.

A second photopolymerizable coating of the same composition was made on a temporary support consisting of a 0.001 inch (0.0025 cm) polyethylene terephthalate film base having a silicone release coating 2. A 0.00075 inch (0.0019 cm) polypropylene cover sheet 3 was laminated to the dried photopolymerizable layer 1. The layer was imagewise exposed through a second halftone negative film 4 with its emulsion side in contact with the cover sheet 3. The silicone-release subbed polyethylene terephthalate film base 2 was removed and the revealed face of the photopolymerizable layer 1, the face opposite to that which was exposed, was laminated to the surface of the first photopolymerizable layer. The polypropylene cover sheet 3 was then removed.

The layered photopolymerized film was charged as described in Example 2 and the film surface 7 was developed with liquid developer 8 as described in Example 1. The resulting developed image was a superposition of the images of the two photopolymerizable layers with images resulting from both the bottom layer (the layer contacting the conductive support) and from the top layer of the same handedness as that of the halftone negative films 4 and 4' used for exposure. The developed image was transferred to paper and fused as described in Example 1. This afforded a halftone dot range of 4-93% (150 line/inch screen) from the image from the top layer, with good solid areas and line-work from the image from the bottom layer.

EXAMPLE 4

The photopolymerizable composition described in Example 1 was coated on a transparent conductive substrate, consisting of indium-tin oxide on 0.007 inch (0.018 cm) polyethylene terephthalate. A 0.00075 inch (0.0019 cm) polypropylene cover sheet was laminated to the dried photopolymerizable layer and the element was imagewise exposed through a halftone negative film as described in Example 1. A second photopolymerizable coating, the second coating described in Example 3, was exposed as described in Example 3 and then laminated to the photopolymerizable layer of the above photopolymerizable element as described in Example 3. Removal of the cover sheet left the two laminated photopolymerizable layers on the indium tin oxide-coated polyethylene terephthalate support.

The film was charged as described in Example 2 and developed as described in Example 1. Results were comparable to those of Example 3.

EXAMPLE 5

A two layer imaged photopolymerizable composition was prepared as described in Example 3. The film was charged by passing over a +5.5 kV corotron at 1 inch (2.54 cm)/sec. Dry electrostatic toner developer (Kodak Ektaprint 85 Copier Monocomponent A toner, Eastman Kodak Co., Rochester, N.Y.) was applied by gently blowing it across the surface of the film. The image from the top layer had toned resolution of 15 line pairs/mm, and the image from the bottom layer had good toned solid areas and line-work.

EXAMPLE 6

A photopolymerizable composition consisting of 50.3% polymethylmethacrylate, 29% ethoxylated trimethylolpropane triacrylate, 10.6% 2,2',4,4'-tetrakis (o-chlorophenyl)-5,5'-bis(m,p-dimethoxyphenyl)-biimidazole, 3.0% bis(p-diethylamino-o-tolyl)phenyl methane, 3.3% p-toluenesulfonic acid, and 3.8% 2-mercaptobenzoxazole was coated on an 0.004 inch (0.0102 cm) aluminized polyethylene terephthalate film substrate. A 0.00075 inch (0.0019 cm) polypropylene cover sheet was laminated to the dried photopolymerizable layer. The photopolymerizable element was exposed imagewise (for 2 integrated intensity units) through a halftone negative film with its emulsion side in contact with the cover sheet, using a Douthitt Option X exposure unit (manufactured by Douthitt Corp., Detroit, Mich.), equipped with a model TU 64 Violux® 5002 lamp assembly (Exposure Systems Corp., Bridgeport Conn.) and a photopolymer type 5027 lamp. The cover sheet was then removed.

A second photopolymerizable composition consisting of 57% polymethylmethacrylate, 28.6% ethoxylated trimethylolpropane triacrylate, 10.6% 2,2',4,4'-tetrakis (o-chlorophenyl)-5,5'-bis(m,p-dimethoxyphenyl)-biimidazole, and 3.8% 2-mercaptobenzoxazole was coated on an 0.007 inch (0.0102 cm) temporary polyethylene terephthalate support. A 0.00075 inch (0.0019 cm) polypropylene cover sheet was laminated to the dried photopolymerizable layer. The element was imagewise exposed through a second halftone negative film for 16 integrated units with the exposure source described above, and the cover sheet removed. The revealed surface of the photopolymerizable layer was laminated to the surface of the first photopolymerizable layer with four passes through a heated, 230° F. (110° C.) two roll device at 1 inch (2.54 cm)/sec, the two photopolymerizable layers being in contact. The temporary polyethylene terephthalate support was then removed, leaving the two laminated photopolymerized layers on the aluminized polyethylene terephthalate support.

The layered photopolymerized film was charged positively by passing over a +5.4 kV corotron at 0.5 inch (1.77 cm)/sec. The film was developed, first, 3 seconds after charging with negatively-charged cyan liquid electrostatic toner, using a 0.04 inch (10.16 mm) developer-filled gap between a flat development plate and the charged film, and then toned, second, 45 seconds after charging with negatively-charged black liquid electrostatic developer, again using a 0.04 inch (10.16 mm) developer-filled gap between a flat development electrode, biased at +50V.

The cyan developer was prepared using the following procedure: In a Union Process 1-S Attritor, Union Process Company, Akron, Ohio was placed the following ingredients:

| Ingredient | Amount (g) |
| --- | --- |
| Copolymer of ethylene (89%) and methacrylic acid (11%), melt index at 190° C. is 100, Acid No. is 66 | 200.0 |
| Heucophthal Blue G XBT-583D Heubach, Inc., Newark, NJ | 14.0 |
| Dalamar® Yellow YT-858D Heubach, Inc., Newark, NJ | 0.15 |
| Ethylene glycol | 13.3 |
| Isopar®-L, nonpolar liquid having a Kauri-butanol value of 27, Exxon Corp | 1000.0 |

The ingredients were heated to 100° C.±10° C. and milled at a rotor speed of 230 rpm with 0.1875 inch (4.76 mm) diameter stainless steel balls for two hours. The attritor was cooled to room temperature while the milling was continued and then 700 grams of Isopar®-H, nonpolar liquid having a Kauri-butanol value of 27, Exxon Corporation, were added. Milling was continued at a rotor speed of 330 rpm for 22 hours to obtain toner particles with an average size of 1.6 μm by area. The particulate media were removed and the dispersion of toner particles then diluted to 2.0 percent solids with additional Isopar®-H. To 1500 grams of this developer was added 7.5 grams of a 10% solution of purified grade lecithin, Fisher Scientific, Pittsburgh, Pa. in Isopar®-H, and 30 grams of 10% by weight of Oloa®-1200, Chevron Corporation, in Isopar®-H.

The black developer was prepared using the following procedure: In a Union Process 1-S Attritor, Union Process Company, Akron, Ohio, was placed the following ingredients:

| Ingredient | Amount (g) |
| --- | --- |
| Copolymer of ethylene (89%) and methacrylic acid (11%), melt index at 190° C. is 100, Acid No. 66 | 200.0 |
| Sterling®NS carbon black Cabot Corp., Boston, Mass. | 48.6 |
| Heucophthal Blue G XBT-583D Heubach, Inc., Newark, NJ | 2.0 |
| Aluminum Tristearate®132 Witco Chemical Corp., New York, NY | 2.5 |
| Isopar®-L, nonpolar liquid having a Kauri-butanol value of 27, Exxon Corp | 1000.0 |

The ingredients were heated to 100° C.±10° C. and milled at a rotor speed of 230 rpm with 0.1875 inch (4.76 mm) diameter stainless steel balls for two hours. The attritor was cooled to room temperature while the milling was continued and then 700 grams of Isopar®-L, nonpolar liquid having a Kauri-butanol value of 27, Exxon Corporation, were added. Milling was continued at a rotor speed of 330 rpm for 19 hours to obtain toner particles with an average size of 1.6 μm by area. The particulate media were removed and the dispersion of toner particles then diluted to 2.0 percent solids with additional Isopar®-H. To 2000 grams of this developer was added 14 grams of a 10% solution of Basic Barium Petronate® oil-soluble petroleum sulfonate, Sonneborn Division of Witco Chemical Corp., New York, N.Y. in Isopar®-L.

The resulting two-color toned image was a superposition of the images of the two photopolymerizable layers. The image resulting from the bottom layer (the layer contacting the conductive support), corresponding to the first halftone negative film was toned with cyan. The image resulting from the top layer, corresponding to the second halftone negative film, was developed with both cyan and black, and thus appeared black.

The two-color developed image was electrostatically transferred to paper using a bias roll. Plainwell Solitaire offset enamel paper (Plainwell Co., Plainwell, Mich.) was wrapped around a metal drum to which +500 V was applied. The developed photopolymerizable film was spaced 0.006 inch (0.015 cm) from the paper, the gap being filled with Isopar ®-H. Transfer was carried out at 0.5 inch (1.77 cm) per second. The paper was removed from the bias roll and was heated at 110° C. for 1 minute to fuse the developed image and fix it to the paper.

EXAMPLE 7

A photopolymerizable composition as described in Example 1 is coated on a temporary support base 2. A polypropylene cover sheet 3 is laminated to the dried photopolymerizable layer 1. The photopolymerizable element formed is exposed imagewise through a halftone negative film 4' with its emulsion side in contact with the cover sheet, as described in Example 1. The cover sheet is then removed, and the revealed surface of the photopolymerizable layer is laminated to a conductive support 6, consisting of aluminized polyethylene terephthalate. The temporary support base 2 is then removed.

The second coating of the photopolymerizable composition described above is also coated on a temporary support base 2. A polypropylene cover sheet 3 is laminated to the dried photopolymerizable layer 1. This photopolymerizable element is imagewise exposed through a second halftone negative film 4, with its emulsion side in contact with the cover sheet. The temporary support 2 is then removed, and the revealed surface of the photopolymerizable layer (the surface opposite to that which was exposed) is laminated to the surface of the first photopolymerizable layer 1. The cover sheet 3 is then removed, leaving the two laminated photopolymerized layers on the aluminized polyethylene terephthalate support 6.

The layered photopolymer film is charged and toned as described in Example 1. The resulting toned imaged is a superposition of the images of the two photopolymerizable layers. The image resulting from the bottom layer (the layer contacting the conductive support) is of opposite handedness as that of the halftone negative film 4' used for exposure. The image resulting from the top layer is of the same handedness as that of the halftone negative film 4 used in exposure.

Alternatively, the second coating of the photopolymerizable composition described above is coated on a temporary support base 2. A polypropylene cover sheet 3 is laminated to the dried photopolymerizable layer 1. This element is imagewise exposed through a second halftone negative film 4, with its emulsion side in contact with the cover sheet. The cover sheet is then removed, and the revealed surface of the photopolymerizable layer is laminated to the surface of the first photopolymerizable layer 1. The temporary support base 2 is then removed, leaving the two laminated photopolymerized layers on the aluminized polyethylene terephthalate support 6.

The layered photopolymer film is charged and developed as described in Example 1. The resulting developed image is a superposition of the images of the two photopolymerizable layers. The image resulting from the bottom layer (the layer contacting the conductive support) and the image resulting from the top layer are of opposite handedness as that of the halftone negative films used for exposure. Lateral reversal occurs in transfer of the developed image to paper so that the superimposed images on paper are of the same handedness as that of the halftone negative films.

We claim:

1. A process for the preparation of high resolution images comprising
   (A) exposing a photopolymerizable electrographic element comprising in order; a conductive support, a first photopolymerizable layer and a strippable cover sheet, imagewise to actinic radiation through the cover sheet;
   (B) stripping the cover sheet from the imagewise exposed photopolymerizable layer;
   (C) laminating to the surface of the imagewise exposed photopolymerizable layer a photopolymerizable element comprising an imagewise exposed photopolymerizable layer on a temporary surface, the two photopolymerizable layers in contact;
   (D) peeling off the temporary surface from the exposed photopolymerizable layer;
   (E) charging electrostatically the exposed photopolymerizable layers; and
   (F) developing the electrostatically charged exposed image with a first developer.

2. A process according to claim 1 wherein the developer image is transferred to a receptor support.

3. A process according to claim 1 wherein the electrostatically charged exposed image is developed with a first developer, and after the charge on the first photopolymerizable layer has dissipated, the charge on the second layer is developed with a second developer.

4. A process according to claim 3 wherein the finally developed image is transferred to a receptor support.

5. A process according to claim 1 wherein each photopolymerizable layer consists essentially of an organic polymeric binder, at least one compound having at least one ethylenically unsaturated group, and a photoinitiator.

6. A process according to claim 5 wherein the photopolymerizable layer contains a chain transfer agent.

7. A process according to claim 6 wherein the photopolymerizable layer contains an organic compound selected from the group consisting of at least one organic electron donor, at least one organic electron acceptor, and a substituted aromatic amino compound with or without a strong acid.

8. A process according to claim 1 wherein the exposed photopolymerizable layers are charged by corona discharge.

9. A process according to claim 1 wherein the developing is accomplished with a dry electrostatic toner developer.

10. A process according to claim 1 wherein the developing is accomplished with a liquid electrostatic developer.

11. A process according to claim 10 wherein the liquid electrostatic developer consists essentially of (a) a nonpolar liquid having a Kauri-butanol value of less than 30, present in a major amount, (b) thermoplastic resin particles having an average by area particle size of less than 10 μm, and (c) a nonpolar liquid soluble charge director compound.

12. A process according to claim 11 wherein the developed image is transferred to a receptor support.

13. A process according to claim 11 wherein the electrostatically charged exposed image is developed with a first developer, and after the charge on the first photopolymerizable layer has dissipated, the charge on the second layer is developed with a second developer.

14. A process according to claim 13 wherein the finally developed image is transferred to a receptor support.

15. A process according to claim 14 wherein the transfer is accomplished by electrostatic means.

16. A process for the preparation of a high resolution, correct reading image comprising
   (A) exposing a photopolymerizable electrographic element comprising in order, a temporary support, a first photopolymerizable layer, and a strippable cover sheet, imagewise to actinic radiation through the cover sheet;
   (B) stripping the cover sheet from the exposed photopolymerizable layer;
   (C) laminating the surface of the exposed photopolymerizable layer to a conductive substrate;
   (D) peeling off the temporary support from the exposed photopolymerizable layer;
   (E) laminating to the surface of the imagewise exposed photopolymerizable layer a photopolymerizable element comprising an imagewise exposed photopolymerizable layer on a temporary surface, the two photopolymerizable layers in contact;
   (F) peeling off the temporary surface from the exposed photopolymerizable layer;
   (G) charging electrostatically the exposed photopolymerizable layers to form a latent image of electrostatic charge on the exposed areas;
   (H) developing the electrostatically charged exposed image with a developer.

17. A process according to claim 16 wherein the developed image is transferred to a receptor support.

18. A process according to claim 16 wherein the electrostatically charged developed exposed image, after the charge on the first photopolymerizable layer has dissipated, is developed with a second developer.

19. A process according to claim 18 wherein the finally developed image is transferred to a receptor support.

20. A process according to claim 16 wherein each photopolymerizable layer consists essentially of an organic polymeric binder, at least one compound having at least one ethylenically unsaturated group, and a photoinitiator.

21. A process according to claim 20 wherein the photopolymerizable layer contains a chain transfer agent.

22. A process according to claim 21 wherein the photopolymerizable layer contains an organic compound selected from the group consisting of at least one organic electron donor, at least one organic electron acceptor, and a substituted aromatic amino compound with or without a strong acid.

23. A process according to claim 16 wherein the exposed photopolymerizable layers are charged by corona discharge.

24. A process according to claim 16 wherein the developing is accomplished with a dry electrostatic developer.

25. A process according to claim 16 wherein the developing is accomplished with a liquid electrostatic developer.

26. A process according to claim 25 wherein the liquid electrostatic developer consists essentially of (a) a nonpolar liquid having a Kauri-butanol value of less than 30, present in a major amount, (b) thermoplastic resin particles having an average by area particle size of less than 10 $\mu$m, and (c) a nonpolar liquid soluble charge director compound.

27. A process according to claim 26 wherein the developed image is transferred to a receptor support.

28. A process according to claim 26 wherein the electrostatically charged developed exposed image, after the charge on the first photopolymerizable layer has dissipated, is developed with a second developer.

29. A process according to claim 28 wherein the finally developed image is transferred to a receptor support.

30. A process according to claim 29 wherein the transfer is accomplished by electrostatic means.

* * * * *